US008664921B2

United States Patent
Hiltner

(10) Patent No.: US 8,664,921 B2
(45) Date of Patent: Mar. 4, 2014

(54) MEANS OF PROVIDING VARIABLE REACTIVE LOAD CAPABILITY ON AN ELECTRONIC LOAD

(75) Inventor: David F. Hiltner, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 265 days.

(21) Appl. No.: 13/197,999

(22) Filed: Aug. 4, 2011

(65) Prior Publication Data

US 2013/0033239 A1  Feb. 7, 2013

(51) Int. Cl.
*G05F 3/00* (2006.01)
(52) U.S. Cl.
USPC ............ 323/208; 324/73.1; 324/750.01; 324/750.02
(58) Field of Classification Search
USPC ............ 323/208; 324/73.1, 750.02, 764.01, 324/761.01–762.05; 703/13–15
See application file for complete search history.

(56) References Cited

U.S. PATENT DOCUMENTS

| | | | |
|---|---|---|---|
| 4,288,739 A | 9/1981 | Nercessian | |
| 4,357,574 A | 11/1982 | Takamisawa et al. | |
| 6,411,098 B1 * | 6/2002 | Laletin | 324/436 |
| 6,639,518 B1 * | 10/2003 | Curtis | 340/635 |
| 6,693,436 B1 * | 2/2004 | Nelson | 324/537 |
| 7,397,262 B2 * | 7/2008 | Bailey et al. | 324/750.05 |
| 7,436,200 B1 | 10/2008 | Jacobsen et al. | |
| 7,466,162 B2 | 12/2008 | Wong et al. | |
| 7,933,732 B2 | 4/2011 | Kao et al. | |
| 2003/0067314 A1 * | 4/2003 | Kaukko | 324/754 |

* cited by examiner

*Primary Examiner* — Adolf Berhane
*Assistant Examiner* — Emily P Pham
(74) *Attorney, Agent, or Firm* — Marger Johnson & McCollom, PC; Thomas F. Lenihan

(57) ABSTRACT

Embodiments of the invention include an electronic load having variable reactive load capability and techniques for controlling and/or modeling a reactive component in a load. The electronic load can include a user interface through which a latency value is received from a user. A delay is created based on the latency value between the time that a variable of the input signal is sensed and the time that a variable of the input signal is driven to a new value, thereby simulating a reactive component in the electronic load based on the created delay. In one example embodiment, the driven variable can be stepped after the created delay to produce an approximation of a capacitive or inductive element. In another example embodiment, the driven variable can be slewed during the delay period using an arbitrary waveform generator, thereby more accurately simulating the reactive component.

17 Claims, 3 Drawing Sheets

MEANS OF PROVIDING VARIABLE REACTIVE LOAD CAPABILITY ON AN ELECTRONIC LOAD

FIELD OF THE INVENTION

This disclosure relates generally to an electronic load, and in particular, to a method, apparatus, and/or means for providing an improved electronic load.

BACKGROUND OF THE INVENTION

Electronic loads are used in a variety of industries particularly for testing electrical or electronic equipment such as power supplies, batteries, solar cells, cell phones, communication systems, among an assortment of other types of circuitry and devices. An electronic load is a device that simulates loading on an electronic circuit in lieu of a traditional ohmic load resistor. Contrary to a current source, the electronic load is traditionally used as a current sink. The electronic load generally consumes electrical energy and transforms it into another form of energy, such as heat.

Some electronic loads provide different operating modes such as constant current, constant voltage, constant power, or constant resistance modes. For instance, the electronic load can receive a user settable resistance value and operate in a constant resistance mode in which either the voltage or current in the circuit is sensed, and the current or voltage is adjusted, respectively, to maintain the resistance designated by the user. In other words, if the voltage is sensed by the electronic load, then the current can be driven by the electronic load to maintain a form of constant resistance within the electronic load. Similarly, if the current is sensed by the electronic load, then the voltage can be driven by the electronic load to maintain a form of constant resistance within the electronic load. The relationship between the current, voltage, and resistance can be maintained as a result of Ohm's law.

In the constant resistance mode, there is a small delay introduced between the time of sensing the control variable and the time of driving the controlled variable. The delay is usually on the order of nanoseconds or microseconds, and is inherently dependent on the processing time or propagation time of circuitry used in sensing and controlling the signal under test. Depending upon whether the current is measured, and the voltage controlled, or the voltage measured, and the current controlled, such delay can cause a reactive component to the load to look slightly capacitive or slightly inductive, respectively. Such delay is not specified in the industry, and while known to some, it is generally thought of as a flaw in the system.

It would be desirable to have an electronic load in which control is provided over the propagation delay in order to model the reactive component to the load. Accordingly, a need remains for an improved method and apparatus for providing variable reactive load capability on an electronic load.

DETAILED DESCRIPTION

Embodiments of the invention include an electronic load having variable reactive load capability and techniques for controlling and/or modeling a reactive component in a load. The electronic load can include a user interface through which a latency value is received from a user. A delay is created based on the latency value between the time that a variable of the input signal is sensed and the time that a variable of the input signal is driven to a new value, thereby simulating a reactive component in the electronic load based on the created delay.

In one example embodiment, the driven variable can be stepped after the created delay to produce an approximation of a capacitive or inductive element. In another example embodiment, the driven variable can be slewed during the delay period using, for instance, an arbitrary waveform generator, thereby more accurately simulating the reactive component. In other words, either a capacitive filter or an inductive filter, or both, can be applied to the input signal. These and other features and embodiments of the present invention proceed with reference to each of the figures.

Figure 1:
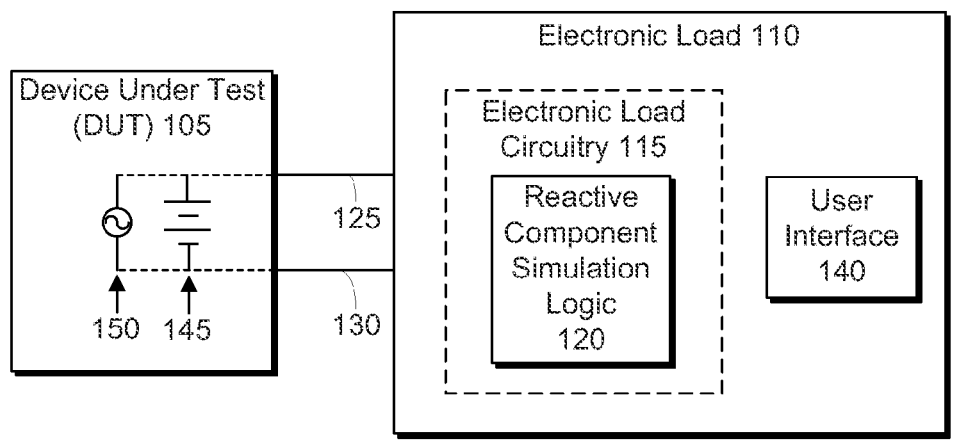
FIG. 1 illustrates a high level block diagram of an electronic load including reactive component simulation logic, according to an example embodiment of the present invention.

FIG. 1 illustrates a high level block diagram of an electronic load 110 and device under test (DUT) 105 according to an example embodiment of the present invention. It should be understood that the term "electronic load" generally refers to a device that simulates loading on an electronic circuit or other electrical device, and should be construed broadly; for example, the term can include dummy loads, dummy antennas, radio frequency termination devices, simulated resistor banks, or the like.

In some embodiments, the electronic load 110 includes electronic load circuitry 115 and a user interface 140. The electronic load circuitry 115 can include analog and/or digital circuitry, which can be controlled with firmware, software, or any combination thereof. The user interface 140 can include a display and one or more input sensors, including push buttons, touch screens, key pads, or the like.

A device under test (DUT) 105 can be connected to the electronic load 110 over lines 125 and/or 130, and transmit an electrical signal under test to the electronic load 110. The electronic load 110 can receive DC signals from DC source 145, AC signals from AC source 150, and/or any other type of electrical signal including analog and/or digital signals, produced by the DUT 105.

An engineer, technician, or other user of the electronic load can enter a latency value through the user interface 140, which can range from nanoseconds to any number of seconds, depending on the degree to which the user wants to simulate a reactive component to the load, and/or a combination of reactive and resistive loads.

In response to the entered latency value, a delay is created between the time that an electrical characteristic (e.g., current or voltage) of the input signal is sensed and the time that a different but related electrical characteristic (e.g., voltage or current) of the input signal is driven to a new level, thereby simulating a reactive component in the electronic load based on the created delay. The created delay introduces a phase shift in the signal, which is dependent on the frequency of the input signal under test.

The phase shift between the voltage and the current is within the range of 90 degrees (fully reactive) and 0 degrees (fully resistive), exclusive of the end boundaries. In other words, there is at least a small inherent delay caused by the circuitry (e.g., operational amplifier, filter, etc.) used in sensing and/or controlling the signal under test, and thus, the load is not fully resistive. Such inherent delay causes a small amount of reactance in the load, and is not easily controlled or modified other than through a re-design or optimization of the circuitry itself.

To control the reactance of the load in accordance with embodiments of the present invention, a delay is created in addition to the inherent delay, so that the created delay that is controllable by the user allows for the simulation of more significant capacitive and/or inductive elements within the load. The controlled delay effectively provides a variable single-pole or multi-pole filter to the user for adjusting the reactive component of the simulated load. The user can select a preference for a capacitive or inductive filter, indicate a latency value, and/or select other suitable parameters for simulating the reactive component in the load.

Figure 2:
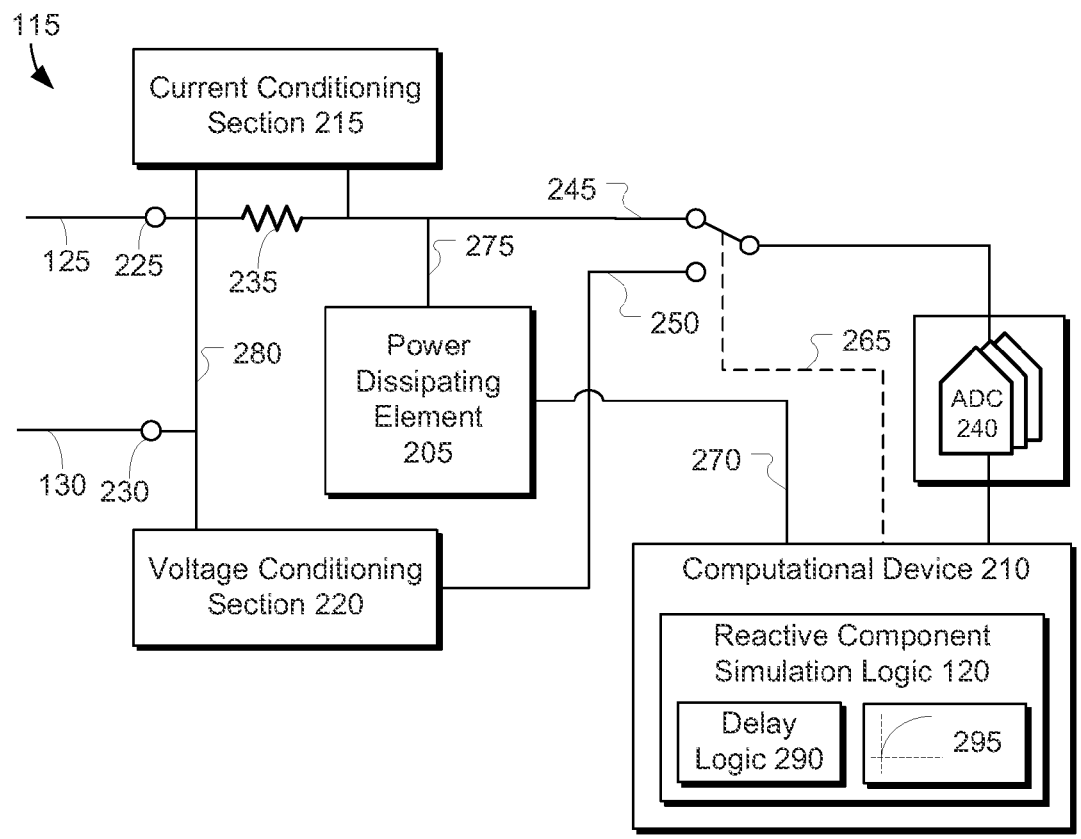
FIG. 2 illustrates a block diagram of circuitry within the electronic load of FIG. 1, including the reactive component simulation logic.

FIG. 2 illustrates a block diagram of circuitry 115 within the electronic load 110 of FIG. 1. One or more of the input lines 125 and 130 carrying the signal under test can be connected to one or more of the terminals 225 and 230. Generally, a constant or varying voltage is placed across the terminals 225 and 230, causing current to be transferred over the lines 125 and 130, which comprise the input signal. The electronic load circuitry 115 can include a current conditioning section 215 to sense a current (I) value of the input signal under test. The current conditioning section 215 can measure the current (I) using the shunt resistor 235. Moreover, a voltage conditioning section 220 can sense or otherwise measure a voltage (V) value of the input signal under test. The voltage conditioning section 220 may be connected to the current condition section 215 over line 280.

In addition, the load circuitry 115 can include a power dissipating element 205. The power dissipating element 205 can include, for example, a collection of switched resistors, MOSFETs, and/or BJTs, among other suitable power dissipating circuitry, and may be connected to other components of the circuit using line 275. The power dissipating element 205 is configured to adjust the current (I) or the voltage (V) of the input signal based on the other characteristic, so that a substantially constant resistance can be maintained in a constant resistance mode. It should be understood that the "constant resistance" terminology is somewhat inexact—it is more accurate to view it as a constant impedance with at least some reactive component caused by the inherent delay in the circuitry, and if a further delay is created, then even more reactance is simulated within the load.

A computational device 210 is coupled to the power dissipating element 205. The computational device can include analog and/or digital circuit components, which can be controlled with firmware, software, or any combination thereof. For instance, the computational device 210 can be a microprocessor, or alternatively, a combination of analog circuit components. The computational device 210 receives current (I) information 245 from the current conditioning section 215 and/or voltage (V) information 250 from the voltage conditioning section 220. The current and voltage information can be digitized by one or more analog to digital converters (ADCs) 240 prior to being received by the computational device 210. The computational device can select between current or voltage information using selector 265. For digital systems, the selector 265 can be, for example, a switch or multiplexor. For an analog system, the selector 265 can be, for example, a relay or some other sensor for discerning which of the characteristics (voltage or current) is being sensed.

The computational device includes the reactive component simulation logic 120. The reactive component simulation logic 120 includes delay logic 290 that is configured to create or otherwise cause a delay in the power dissipating element 205 based on the latency value received through the user interface 140 (of FIG. 1). For example, the reactive component simulation logic 120 can be configured to cause the power dissipating element 205 using control line 270 to create the delay between the time that the voltage of the input signal is sensed and the time that the power dissipating element adjusts the current of the input signal so that an inductive component is simulated in the electronic load.

Similarly, the reactive component simulation logic 120 can be configured to cause the power dissipating element 205 using the control line 270 to create the delay between the time that the current of the input signal is sensed and the time that the power dissipating element adjusts the voltage of the input signal so that a capacitive component is simulated in the electronic load.

Whether the reactive component simulation logic 120 senses the voltage (V) and drives the current (I) in accordance with the delay, or senses the current (I) and drives the voltage (V) in accordance with the delay, in either case, the user can select such operational mode through the user interface 140. In other words, the user can make a selection for simulating either an inductive or a capacitive component within the electronic load, or otherwise make a selection for applying either an inductive filter or a capacitive filter, or both. Alternatively, the reactive component simulation logic 120 can automatically determine whether to simulate an inductive component, a capacitive component, or both.

The reactive component simulation logic 120 can also include wave-shaping logic 295 such as an arbitrary waveform generator (AWG), an exponential curve generator, or the like, for shaping the waveform of the driven variable to produce a more accurate simulation of a reactive component within the load, as further described below with reference to FIG. 4. The delay logic 290 can include, among other components, a counter to produce the delay, such as a microprocessor that counts a predefined number of clock cycles. In either the stepped approach or the slewed approach, the delay logic 290 can produce the delay between the time that the sensed variable is determined, and the time that the driven variable is adjusted to a new level.

Figure 3:
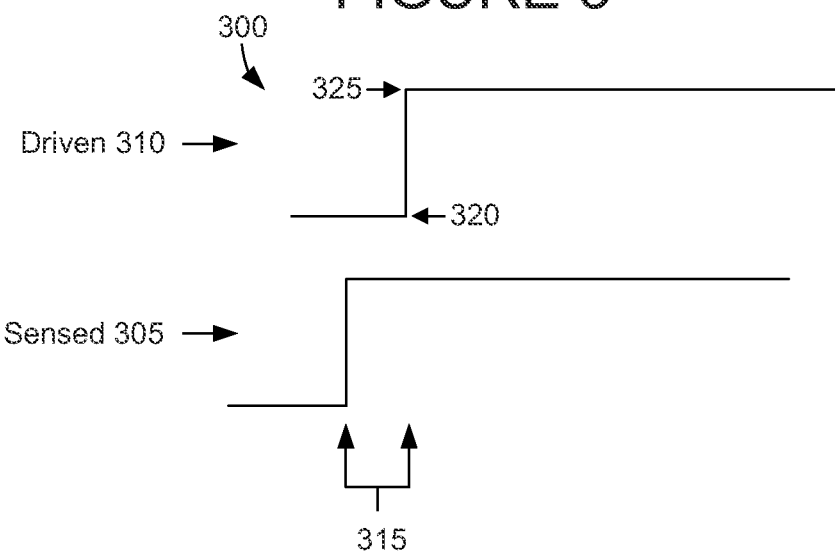
FIG. 3 illustrates a timing diagram of sensed and driven variables according to an example embodiment of the present invention.

FIG. 3 illustrates a timing diagram 300 of sensed and driven variables. Two waveforms, sensed 305 and driven 310, are shown to illustrate one example embodiment of the invention. The sensed variable or characteristic 305 can be either voltage (V) or current (I), and the drive variable or characteristic 310 can be the other variable or characteristic, i.e., current (I) or voltage (V), depending on whether the simulated reactance is to be inductive or conductive. A delay 315 is created in the power dissipating element 205 (of FIG. 2) based on the latency value received through the user interface 140 (of FIG. 1). The delay 315 is in addition to the small inherent propagation delay (not shown) due to sensing and driving circuitry, as mentioned above.

More specifically, the reactive component simulation logic 120 is configured to create or otherwise cause the delay 315 between the time that one of the characteristics of the input signal is sensed and the time that the power dissipating element finishes adjusting the other characteristic so that a reactive component is simulated in the electronic load. The driven variable 310 can be stepped from level 320 to level 325 after the created delay 315 to produce an approximation of a capacitive or inductive element.

When the voltage (V) value is the sensed characteristic, then the current (I) of the input signal can be adjusted, using the power dissipating element, from a first current value 320 to a second current value 325 after the predefined delay 315, thereby simulating an approximation of an inductive component in the load. Alternatively, when the current (I) value is the sensed characteristic, then the voltage (V) of the input signal can be adjusted, using the power dissipating element, from a first current value 320 to a second current value 325 after the predefined delay 315, thereby simulating an approximation of a capacitive component in the load.

Figure 4:
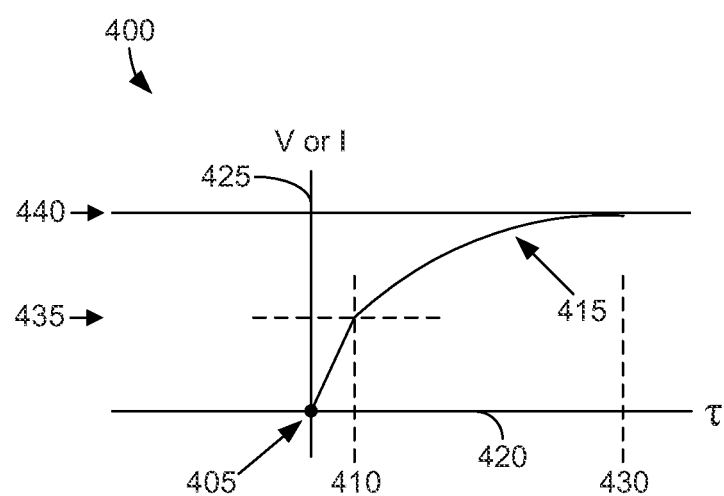
FIG. 4 illustrates a timing diagram of a driven variable according to another example embodiment of the present invention.

FIG. 4 illustrates a timing diagram 400 of a driven variable according to another example embodiment of the present invention. In this approach, a more accurate simulation is created of the behavior of a reactive component in the load. The diagram 400 has a horizontal axis 420 representing time and a vertical axis 425 representing either voltage (V) or current (I), depending on which of these is the driven variable.

In either case, the shape of the driven variable can be slewed as shown at 415 in an exponential fashion. In other words, the driven variable waveform can be shaped relative to time so that a more accurate representation or simulation of a reactive component within the load can be achieved. The shaping of the waveform can be produced, for example, using the wave-shaping logic 295 (of FIG. 2), or other suitable wave-generating logic. It should be understood that the curve need-not be exponential per se, but in the preferred embodiment, can take on the appearance of an exponential-like curve.

The small inherent delay due to the sensing and/or driving circuitry is represented at 410, and the additional wave-shaping between 410 and 430 occurs after the small inherent delay 410 and during the course of an additional created delay. Generally, the small inherent delay is on the order of nanoseconds or microseconds, whereas the created delay between 410 and 430 can be anywhere from a few nanoseconds, microseconds, milliseconds, even up to many seconds.

For example, if it is desirable to simulate the reactive component of a large capacitor, such as a 1 Farad capacitor, the created delay between 410 and 430 is made longer than for a smaller capacitor, such as a micro-Farad capacitor. For inductive component simulation, the created delay between 410 and 430 is larger when simulating the reactive component of a larger inductor, and shorter when simulating the reactive component of a smaller inductor. At a larger extreme, the reactive component of a very large capacitor such as a 100 Farad super capacitor can also be simulated. Indeed, there is no upper bound to the size of the simulated components because the created delay can be increased accordingly. The lower bound is limited by the small inherent delay mentioned above.

The created delay can be produced using the delay logic 290 of FIG. 2. It should be understood that the wave-shaping logic 295 and the delay logic 290 can cooperatively produce the slewed curve. If the input signal includes a stepped signal change, there will be a virtually instant response to the driven variable between point 405 and time 410, but the response will then be retarded by the simulated capacitive or inductive effects along the curve 415. It should also be understood that while FIG. 4 shows an initial adjustment of the driven variable between point 405 and time 410, in some embodiments the adjustment of the driven variable can be made entirely in accordance with the wave-shaping logic 295 and during the created delay between 410 and 430.

When the voltage (V) value is the sensed characteristic, or in other words, an inductive filter is applied to the input signal, then the current (I) value is the driven variable corresponding to the vertical axis of FIG. 4. In such case, the current (I) value of the input signal can be adjusted and wave-shaped, using the power dissipating element 205 and the wave-shaping logic 295, from a first current value (e.g., 435) to a second current value (e.g., 440) during the predefined delay (e.g., difference between time 430 and 410), thereby simulating an inductive component in the load.

When the current (I) value is the sensed characteristic, or in other words, a capacitive filter is applied to the input signal, then the voltage (V) value is the driven variable corresponding to the vertical axis of FIG. 4. In such case, the voltage (V) value of the input signal can be adjusted and wave-shaped, using the power dissipating element 205 and the wave-shaping logic 295, from a first voltage value (e.g., 435) to a second voltage value (e.g., 440) during the predefined delay (e.g., difference between time 430 and 410), thereby simulating a capacitive component in the load.

Figure 5:
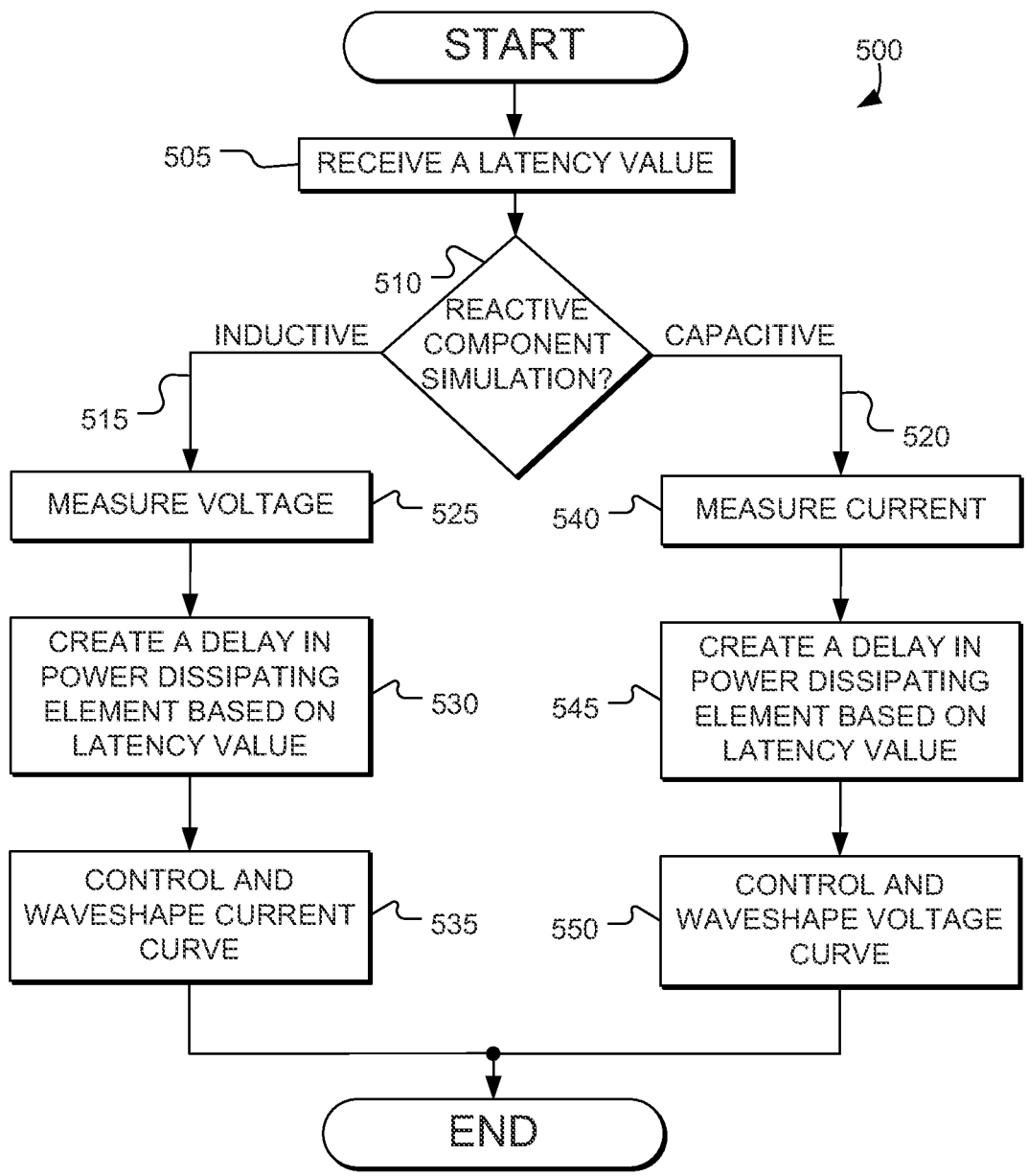
FIG. 5 illustrates a flow diagram of an example technique for providing variable reactive load capability on an electronic load according to some example embodiments of the present invention.

FIG. 5 illustrates a flow diagram 500 of an example technique for providing variable reactive load capability on an electronic load according to some example embodiments of the present invention. The technique begins at 505 where a latency value is received by an engineer, technician, or other user of the electronic load through the user interface. At 510, a determination can be made whether the reactive component simulation is to emulate an inductive component or a capacitive component. The determination can be made by receiving a selection from the user through the interface. Alternatively, the determination can be automatically made by the computational device of the electronic load.

When the simulated reactive component is to be inductive, the flow proceeds along path 515 to box 525, and the voltage of the input signal is sensed or otherwise measured. After which, the flow proceeds to 530 and a delay is created in the power dissipating element based on the latency value, and the current value is driven to a different level. In such manner, an approximation of an inductive element can be simulated. In addition, at 535, the current wave can be controlled or otherwise wave-shaped to provide a more accurate simulation of the inductive element.

Otherwise, when the simulated reactive component is to be inductive, the flow proceeds along path 520 to box 540, and the current of the input signal is sensed or otherwise measured. After which, the flow proceeds to 545 and a delay is created in the power dissipating element based on the latency value, and the voltage value is driven to a different level. In such manner, an approximation of a capacitive element can be simulated. In addition, at 550, the voltage wave can be controlled or otherwise wave-shaped to provide a more accurate simulation of the capacitive element.

Although particular embodiments have been described, it will be appreciated that the principles of the invention are not limited to those embodiments. For example, the wave-shaping logic 295 can control the form of the wave in accordance with a set of parameters or simulated events. If a user wanted to generate a periodic chirp in the load while testing a cell phone device, such qualities can be produced using the components of the computational device 210. A pseudo-random pulse generator can be used to generate pulses in the input signal.

Although particular embodiments have been described, it will be appreciated that the principles of the invention are not limited to those embodiments. Some embodiments can include one or more tangible computer-readable media storing computer-executable instructions that, when executed by a processor, operate to perform the methods described herein. Variations and modifications may be made without departing from the principles of the invention as set forth in the following claims.

The invention claimed is:

1. A method for providing variable reactive load capability on an electronic load, the method comprising:
   receiving a latency value through a user interface of the electronic load;
   receiving an input signal at one or more input terminals of the electronic load;
   sensing a voltage of the input signal;
   adjusting, using a power dissipating element, a current of the input signal from a first current value to a second current value in response to the sensed voltage; and
   creating a delay based on the latency value input through the user interface between the time that the voltage of the input signal is sensed and the time that the power dissipating element adjusts the current to the second current value.

2. The method of claim 1, further comprising:
   simulating a reactive component in the electronic load based on the created delay.

3. The method of claim 2, wherein the reactive component is inductive.

4. The method of claim 1, wherein creating the delay further comprises:
   slewing the shape of a current versus time waveform between the first and second current values.

5. The method of claim 4, wherein slewing the shape further comprises:
   shaping the current versus time waveform using an arbitrary waveform generator.

6. A method for providing variable reactive load capability on an electronic load, the method comprising:
   receiving a latency value through a user interface of the electronic load;
   receiving an input signal at one or more input terminals of the electronic load;
   sensing a current of the input signal;
   adjusting, using a power dissipating element, a voltage of the input signal from a first voltage value to a second voltage value in response to the sensed current; and
   creating a delay based on the latency value input through the user interface between the time that the current of the input signal is sensed and the time that the power dissipating element adjusts the voltage to the second voltage value.

7. The method of claim 6, further comprising:
   simulating a reactive component in the electronic load based on the created delay.

8. The method of claim 7, wherein the reactive component is capacitive.

9. The method of claim 6, wherein creating the delay further comprises:
   slewing the shape of a voltage versus time waveform between the first and second voltage values.

10. The method of claim 9, wherein slewing the shape further comprises:
    shaping the voltage versus time waveform using an arbitrary waveform generator.

11. An electronic load, comprising:
    one or more input terminals to receive an input signal;
    a user interface configured to receive a latency value;
    a first conditioning section configured to sense a first characteristic of the input signal;
    a second conditioning section configured to sense a second characteristic of the input signal;
    a power dissipating element configured to adjust one of the first and second characteristics of the input signal based on the other characteristic; and
    a computational device coupled to the power dissipating element and operable to receive the latency value, wherein the computational device includes reactive component simulation logic configured to create a delay in the power dissipating element based on the latency value received through the user interface.

12. The electronic load of claim 11, wherein the reactive component simulation logic is configured to create the delay between the time that one of the characteristics of the input signal is sensed and the time that the power dissipating element finishes adjusting the other characteristic so that a reactive component is simulated in the electronic load.

13. The electronic load of claim 11, wherein:
    the first conditioning section is a current conditioning section;
    the second conditioning section is a voltage conditioning section;
    the first characteristic is a current value of the input signal; and
    the second characteristic is a voltage value of the input signal.

14. An electronic load, comprising:
    one or more input terminals to receive an input signal;
    a user interface configured to receive a latency value;
    a current conditioning section configured to sense a current value of the input signal;
    a voltage conditioning section configured to sense a voltage value of the input signal;
    a power dissipating element configured to adjust one of the current value and the voltage value of the input signal based on the other one of the current value and the voltage value; and
    a computational device coupled to the power dissipating element, wherein the computational device includes reactive component simulation logic configured to cause the power dissipating element to create a delay between the time that the voltage of the input signal is sensed and the time that the power dissipating element adjusts the current of the input signal so that a reactive component is simulated in the electronic load, the delay based on the latency value received through the user interface.

15. The electronic load of claim 14, wherein the reactive component is inductive.

16. An electronic load, comprising:
    one or more input terminals to receive an input signal;
    a user interface configured to receive a latency value;
    a current conditioning section configured to sense a current value of the input signal;
    a voltage conditioning section configured to sense a voltage value of the input signal;
    a power dissipating element configured to adjust one of the current value and the voltage value of the input signal based on the other one of the current value and the voltage value; and
    a computational device coupled to the power dissipating element, wherein the computational device includes reactive component simulation logic configured to cause the power dissipating element to create a delay between the time that the current of the input signal is sensed and the time that the power dissipating element adjusts the voltage of the input signal so that a reactive component is simulated in the electronic load, the delay based on the latency value received through the user interface.

17. The electronic load of claim 14, wherein the reactive component is capacitive.

\* \* \* \* \*